(12) United States Patent
Ku et al.

(10) Patent No.: US 6,444,551 B1
(45) Date of Patent: Sep. 3, 2002

(54) N-TYPE BURIED LAYER DRIVE-IN RECIPE TO REDUCE PITS OVER BURIED ANTIMONY LAYER

(75) Inventors: Wen-Yu Ku, Taipei; Fang-Cheng Lu, Taoyuan; Ting-Pang Li, Hsin-Chu; Cheng-Chung Wang, Taoyuan, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/910,202

(22) Filed: Jul. 23, 2001

(51) Int. Cl.[7] .............................................. H01L 21/425
(52) U.S. Cl. ...................... 438/530; 438/510; 438/369
(58) Field of Search ................................ 438/530, 369, 438/510

(56) References Cited

U.S. PATENT DOCUMENTS

| 5,034,337 A | 7/1991 | Mosher et al. ................. 437/31 |
| 5,580,808 A | 12/1996 | Kataoka et al. ................ 437/48 |
| 5,587,325 A | * 12/1996 | Comeau ....................... 438/471 |
| 5,963,812 A | 10/1999 | Kataoka et al. .............. 438/304 |
| 6,218,270 B1 | * 4/2001 | Yasunaga ..................... 438/510 |

\* cited by examiner

*Primary Examiner*—John F. Niebling
*Assistant Examiner*—Angel Roman
(74) *Attorney, Agent, or Firm*—George O. Saile; Stephen B. Ackerman; Stephen G. Stanton

(57) ABSTRACT

A method of driving-in antimony into a wafer, including the following steps. A wafer is loaded into an annealing furnace/tool. The wafer having an area of implanted antimony ions. The wafer is annealed a first time at a first temperature in the presence of only a first nitrogen gas flow rate. The wafer is ramped-down from the first temperature to a second temperature in the presence of only an oxygen gas flow rate. The wafer is maintained in the presence of the of oxygen gas flow rate at the second temperature. The wafer is ramped-up from the second temperature to a third temperature in the presence of only the oxygen gas flow rate. The wafer is annealed a second time at the third temperature in the presence of only a second nitrogen gas flow rate to drive-in the antimony ions within the area of implanted antimony.

44 Claims, 3 Drawing Sheets

N-TYPE BURIED LAYER DRIVE-IN RECIPE TO REDUCE PITS OVER BURIED ANTIMONY LAYER

BACKGROUND OF THE INVENTION

Dislocation loops and stacking faults within and upon epitaxial silicon cause epitaxial silicon structure issues and poor electrical performance of devices. The devices have a potential risk of higher current leakages and yield losses.

U.S. Pat. No. 5,963,812 to Kataoka et al. describes an oxidation process for an N-type buried layer (antimony).

U.S. Pat. No. 5,034,337 to Mosher et al. and U.S. Pat. No. 5,580,808 to Kataoka et al. describe drive-in/oxidation processes for N-type buried layers (antimony).

SUMMARY OF THE INVENTION

Accordingly, it is an object of the present invention to provide an N-type drive-in method to reduce pits over a buried antimony (Sb) layer.

Another object of the present invention is to provide an N-type drive-in method of buried Sb layers that leads to enhanced epitaxial silicon quality with concomitant improvements in isolated N-channel transistor performance.

Other objects will appear hereinafter.

It has now been discovered that the above and other objects of the present invention may be accomplished in the following manner. Specifically, a wafer is loaded into an annealing furnace/tool. The wafer having an area of implanted antimony ions. The wafer is annealed a first time at a first temperature in the presence of only a first nitrogen gas flow rate. The wafer is ramped-down from the first temperature to a second temperature in the presence of only an oxygen gas flow rate. The wafer is maintained in the presence of the oxygen gas flow rate at the second temperature. The wafer is ramped-up from the second temperature to a third temperature in the presence of only the oxygen gas flow rate. The wafer is annealed a second time at the third temperature in the presence of only a second nitrogen gas flow rate to drive-in the antimony ions within the area of implanted antimony.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Cause of the Problem Discovered by the Inventors

The following cause of the problem discovered by the inventors is not to be considered prior art for the purposes of this invention.

The inventors have found that the root cause of the dislocation loops has been determined to be antimony (Sb) buried layer implant induced residual lattice strain in polishing silicon substrate. The source of the stacking faults was isolated to surface residue on antimony buried layers after the diffusion cycle. The lattice strain is relieved through judicious antimony buried diffusion cycling. The potential issue will cause stacking faults after epitaxial deposition.

The larger atomic unit (Sb=121.75) implant causes more serious damage on the substrate as opposed to other species such as boron (B), phosphorus (P), boron fluoride ($BF_2$) and arsenic (As).

Figure 1:
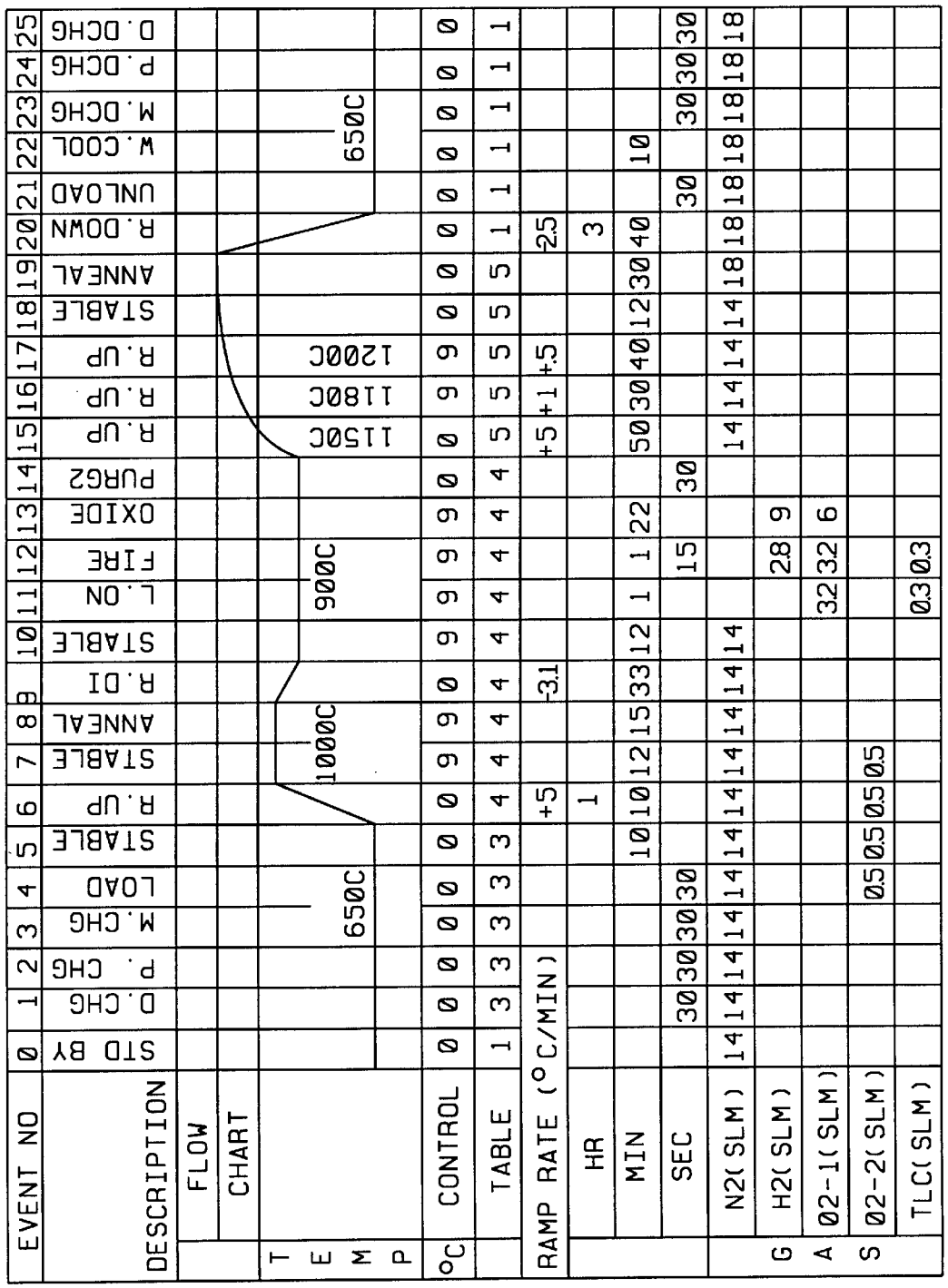
FIG. 1 is a chart illustrating the current antimony buried layer drive-in recipe.

The dislocation loops and stacking faults were always discovered when the current buried layer drive-in recipe (900° C. wet oxidation, i.e. use of $H_2$ and $O_2$ as shown in FIG. 1 (e.g. $2H_2+O_2 \rightarrow 2H_2O$)) was used.

FIG. 1 illustrates the current buried layer drive-in recipe divided into event numbers 0 through 25. Please note that: "M.DCHG" in step 23 (and step 21 of FIG. 8)=monitor control wafer discharge; "P.DCHG" in step 24 (and step 22 of FIG. 8)=production wafer discharge; and "D.DCHG" in step 25 (and step 23 of FIG. 8)=dummy wafer discharge.

Events 8 through 19 are of interest, with events 11 through 14 being of specific interest. After the first anneal at 1000° C. (event 8) a temperature ramp-down (event 9) to 900° C. occurs until a stable 900° C. is achieved (event 10). Theses events occur with an $N_2$ flow as shown under the "gas" parameter section on the lower portion of the recipe.

The $N_2$ gas is stopped and an $O_2$-1 ($O_2$-1: MFC for bigger volume; $O_2$-2: MFC for smaller volume) flow commences at event 11 (L. ON) for 1 minute at 3.2 standard liters/minute (SLM). The $O_2$ flow continues at event 12 (FIRE) and an $H_2$ flow commences at 2.8 SLM and each are increased in the next event 13 (OXIDE): $O_2$ from 3.2 to 6 SLM and the $H_2$ from 2.8 to 9 SLM. Event 13 is when the oxide ($SiO_2$) layer is grown by a wet oxidation process ($2H_2+O_2 \rightarrow 2 H_2O$ e.g.) for about 22 minutes (the main process time can be allowed to adjust in the recipe). A purge of the $O_2$ and $H_2$ gases is then conducted (event 14—"PURG2") and the temperature is ramped-up to 1200° C. (events 15 to 17), stabilized (event 18) and a second anneal is conducted (event 19) (events 15 through 19 under $N_2$ gas) at which point the NBL drive-in (N-type buried [Sb] layer drive-in) occurs.

The overlying oxide layer is then removed from over the previously buried N-type Sb layer.

SEM images have illustrated flaws in the surface of the substrate when subject to the above described current buried layer drive-in recipe. These flaws appear to be linear from a top down view and locate to the buried $N^+$ layer/epitaxial silicon interface. These SEM images indicated that the flaws are always found on the N-type buried layer (NBL) region over the $N^+$ buried layer, i.e. the Sb layer. The linear epitaxial silicon flaws were identified as dislocation loops. Further analysis led to the conclusion that the residual lattice strain from the antimony implant was the source of the dislocation loops.

Preferred Embodiment of the Present Invention

Figure 8:
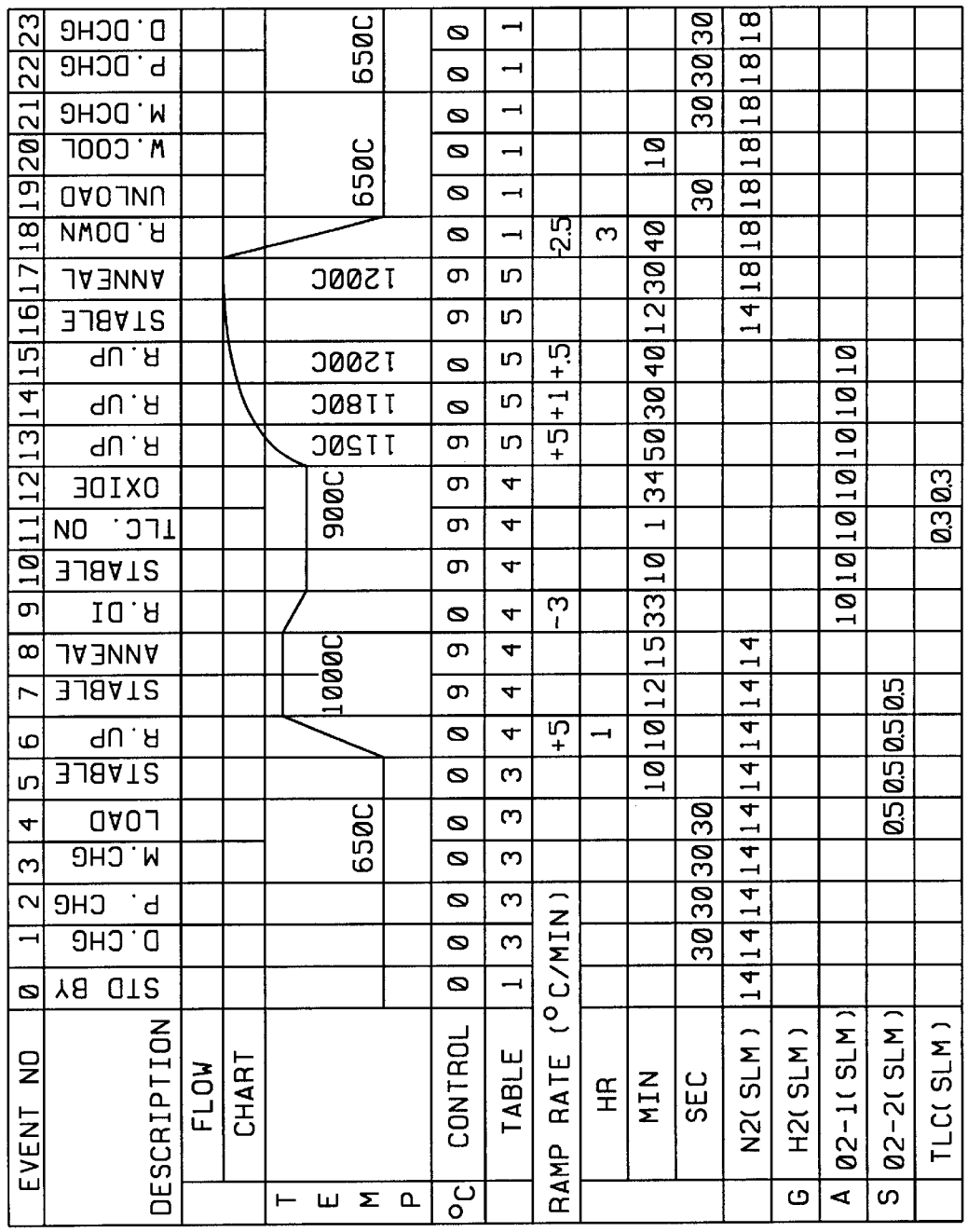
FIG. 8 is a chart illustrating the antimony buried layer drive-in recipe in accordance with the present invention.

Drive-in Recipe of the Present Invention (FIG. 8)

FIG. 8 is a detailed chart describing the process of the present invention divided into events 0 through 23. Of particular interest in the method of the present invention is from events 6 through 18 and more specifically from events 9 through 15. The inventors have discovered that only the one kind of dry oxidation during the specific temperatures as described below will remove the pit issue defect from the surface 19 of the Sb ion implanted area/layer 12.

Point defects and residual lattice strain are induced by the heavy dose, high energy antimony implant. Once the excess point defects and lattice strain arrive at the surface of the Sb ion implanted area/layer 12, they are annihilated by use of an improper wet oxidation method that will cause pits over the buried antimony layer 12 such as noted above. The inventors have discovered that formation of a dry oxidation film 14 (having a lower oxidation rate) during the specific temperatures in accordance with the present invention at events 9 through 15 prior to the Sb drive-in serves to consume this surface of the N-type buried Sb area/layer 12. In the current wet oxidation method at 900° C. as illustrated in event 13 of FIG. 1, for example, it is very difficult to reduce such pits over the buried antimony layer with the faster wet oxidation rate.

It is noted that the chart of FIG. 8 details the more preferred parameters and, unless otherwise indicated, all:

preferred times are ±about 10% (e.g. a more preferred about 10 minute time period noted in the chart of FIG. 8 has a preferred time of from about 9 to 11 minutes);

preferred temperatures are ±about 15° C. (e.g. a more preferred FIG. 8 chart temperature of about 1000° C. has a preferred temperature of from about 985 to 1015° C.);

preferred temperature ramp rates are ±0.5° C./minute (e.g. a more preferred FIG. 8 chart temperature ramp-up rate of about +5° C./minute has a preferred temperature ramp-up rate of from about 4.5 to 5.5 ° C./minute); and preferred gas flow rates are ±10% (e.g. a more preferred gas flow rate of about 10 standard liters/minute (SLM) has a preferred gas flow rate of from about 9 to 11 SLM).

Please refer to the chart of FIG. 8 for specific details not specifically described hereunder.

Initial Structure

Figure 2:
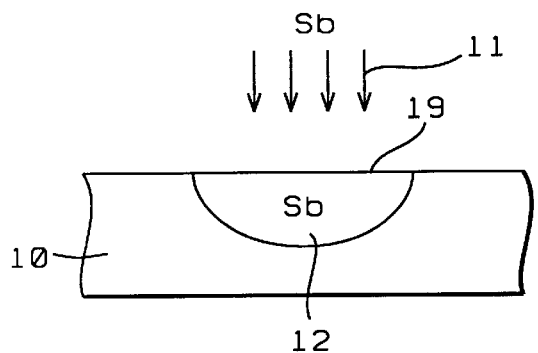
FIGS. 2 to 7 illustrate a preferred embodiment of the present invention.

As shown in FIG. 2, antimony (Sb) ions are implanted 11 into semiconductor wafer 10 within area 12. Semiconductor wafer 10 is preferably comprised of silicon and the area 12 of implanted Sb ions has a concentration of preferably from about 1 E 15 TO 5 E 15 Sb ions/cm$^3$, and more preferably from about 1 E 15±10% Sb ions/cm$^3$. The Sb implant recipe is preferably: energy about 75K; dose–4.0E 15; and tilt about 7 degrees.

Ramp-up of Wafer 10 to About 1000° C.

Wafer 10 is loaded into an appropriate annealing furnace/tool and wafer 10 is ramped-up, at a rate of preferably from about +4.5 to 5.5° C./minute and more preferably at about +5° C./minute, to a stable temperature of preferably from about 985 to 1015° C. and more preferably about 1000° C. (events 6 and 7) in the presence of only $N_2$ and $O_2$. The ramp-up of event 6 takes preferably from about 63 to 77 minutes and more preferably 70 minutes and is held at the stable temperature (event 7) for preferably from about 10.8 to 13.2 minutes and more preferably for about 12 minutes.

First Anneal 15 of Wafer 10

Figure 3:
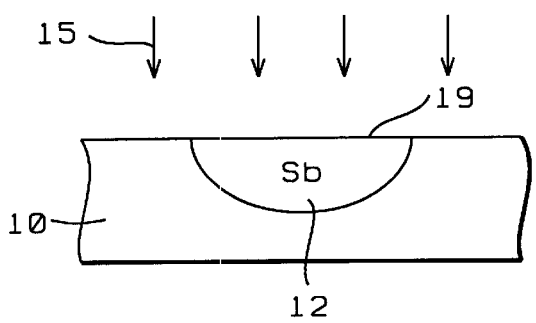
Figure 4:
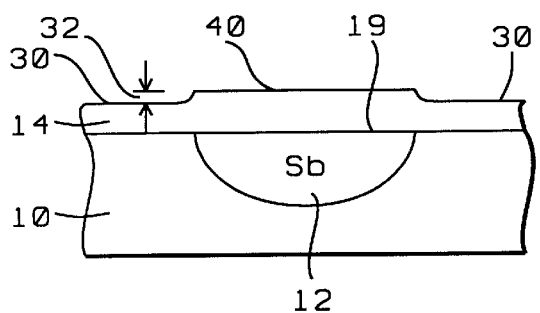

As shown in FIG. 3, wafer 10 is then subjected to a first anneal 15 (event 8) at a temperature of preferably from about 985 to 1015° C. and more preferably of about 1000° C. for preferably from about 13.5 to 16.5 minutes and more preferably for about 15 minutes in the presence of only $N_2$ at a flow rate of from about 12.6 to 15.4 SLM and more preferably about 14 SLM.

Continuous Formation of Oxide Layer 14 During Events 9 Through 15

The key steps of the invention are:

(1) events 9 and 10 with dry oxidation;

(2) events 11 and 12 with dry oxidation; and (3) events 13 to 15 with dry oxidation.

Oxide layer 14 is grown over wafer 10 by dry oxidation to a thickness of:

preferably from about 2250 to 2750 Å and more preferably about 2500 Å over Sb-implanted area 12 at 40; and preferably from about 1890 to 2310 Å and more preferably about 2100 Å over non-Sb-implanted areas at 30;

in the presence of only a continued flow rate of a source of chlorine such as TCA (an ion metal capture), or more preferably TLC (trans-1,2,- dichloroethylene) for environmental protection, (during events 11 and 12) of preferably from about 0.27 to 0.33 SLM and more preferably about 0.30 SLM and a continued flow rate of $O_2$ of preferably from about 9 to 11 SLM and more preferably about 10 SLM during events 9 through 15. The step height 32 between the Sb-implanted oxide layer portion 40 and the non-Sb-implanted oxide layer portions 30 is more preferably about 400 Å A whereas under the old recipe of FIG. 1, the step height was about 2000 Å. With a marked step height 32 as in the old recipe, is easy to cause a water mark.

In the method of the present invention, dry oxidation to form oxide layer 14 is used on three steps (see FIG. 8) to prevent pitting of the surface 19 of the buried Sb ion implanted area/layer 12:

(1) ramping down from more preferably about 1000° C. to more preferably about 900° C. (event 9);

(2) at more preferably about 900° C. (events 10 to 12); and (2) ramping up from more preferably about 900° C. to more preferably 1200° C. (events 13 to 15) as opposed to the single wet oxidation only at 900° C. (event 13 of FIG. 1) in the current process.

The surface 19 of Sb ion implanted area 12 is substantially smooth and unpitted. No $H_2$ is introduced to avoid a wet oxidation that would otherwise cause, or fail to prevent, pitting of surface 19 of Sb ion implanted area 12 (as noted above).

Ramp-Down of Wafer 10 to About 900° C.

Wafer 10 is then ramped-down (event 9), at a rate of preferably from about –2.5 to 3.5° C./minute and more preferably at about –3° C./minute, to a stable temperature (event 10) of preferably from about 885 to 915 ° C. and more preferably about 900° C. in the presence of only $O_2$ (events 9 and 10) at a flow rate of preferably from about 9 to 11 SLM (standard liters/minute) and more preferably about 10 SLM.

Introduction of TLC—Events 11 and 12

More preferably, TLC (trans-1,2,- dichloroethylene), an organic source of chloride and used as a getterer for silicon (Si), is introduced (at event 11) at a flow rate of preferably from about 0.27 to 0.33 SLM and more preferably about 0.30 SLM for from about 50 to 70 seconds and more preferably for about 1 minute (event 11) and continuing for from about 32 to 36 minutes and more preferably about 34 minutes (event 12) with a continued flow rate of $O_2$ of preferably from about 9 to 11 SLM (standard liters/minute) and more preferably about 10 SLM (events 11 and 12). The main process time of preferably from about 32 to 36 minutes and more preferably about 34 minutes (event 12) can be allowed to adjust in the recipe.

Other equivalent sources of chlorine may be used such as TCA (see above), although TLC is now more preferred for environmental protection reasons.

Ramp-up of Wafer 10 to About 1200° C.

Wafer 10 with oxide layer 14 is then ramped up, in a series of steps (events 13, 14 and 15) to a temperature of preferably from about 1185 to 1215° C. and more preferably about 1200° C. in the presence of only $O_2$ at a continued flow rate of from about 9 to 11 SLM and more preferably about 10 SLM.

In the first step (event 13), wafer 10 is ramped-up at a rate of preferably from about +4.5 to 5.5° C./minute and more preferably of about +5° C./minute from about more preferably 900° C. to preferably about 1135 to 1165° C. and more preferably about 1150° C. for preferably from about 45 to 55 minutes and more preferably about 50 minutes in the presence of only $O_2$ at a continued flow rate of from about 9 to 11 SLM and more preferably about 10 SLM.

In the second step (event 14), wafer 10 is further ramped-up at a rate of preferably from about +0.8 to 1.2° C./minute and more preferably of about +1° C./minute from about more preferably 1150° C. to preferably about 1165 to 1195° C. and more preferably about 1180° C. for preferably from about 27 to 33 minutes and more preferably about 30 minutes in the presence of only $O_2$ at a continued flow rate of from about 9 to 11 SLM and more preferably about 10 SLM.

In the third step (event 15), wafer 10 is further ramped-up at a rate of preferably from about +0.4 to 0.6° C./minute and more preferably of about +0.5° C./minute to preferably about 1185 to 1215° C. and more preferably about 1200° C. for preferably from about 36 to 44 minutes and more preferably about 40 minutes in the presence of only $O_2$ at a continued flow rate of from about 9 to 11 SLM and more preferably about 10 SLM.

Wafer 10 is then stabilized at more preferably about 1200° C. (event 16) for preferably from about 10.8 to 13.2 minutes to more preferably about 12 minutes in the presence of only $N_2$ at a flow rate of from about 12.6 to 15.4 SLM and more preferably about 14 SLM.

Second Anneal 17 of Wafer 10

Figure 5:
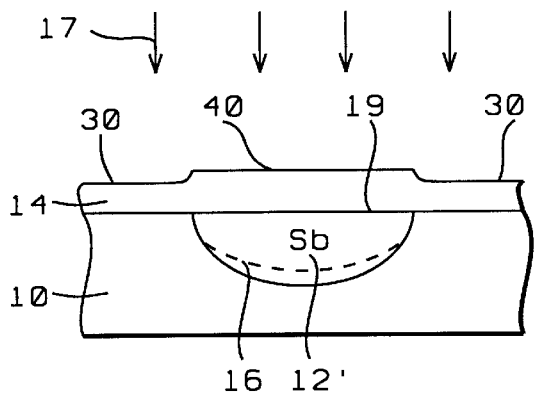

As shown in FIG. 5, wafer 10 is then subjected to a second anneal 17 (event 17) to drive-in the Sb ions as illustrated at 16 of FIG. 5. The second anneal 17 is conducted at a temperature of preferably about 1185 to 1215° C. and more preferably about 1200° C. for preferably from about 27 to 33 minutes and more preferably for about 30 minutes in the presence of only $N_2$ at a flow rate of preferably from about 12.6 to 15.4 SLM and more preferably about 14 SLM.

Wafer 10 is then ramped-down to a temperature of preferably about 650° C. (event 18), unloaded (by robot) (event 19), cooled down (event 20), then monitor control wafer discharge (event 21), production wafer discharge (event 22) and dummy wafer discharge (event 23).

Removal of Oxide Layer 14

Figure 6:
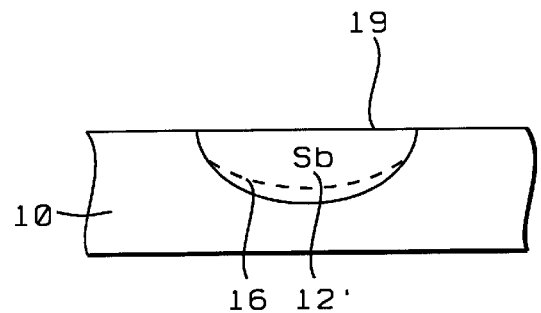

As shown in FIG. 6, oxide layer 14 is then removed from wafer 10, exposing the surface 19 of Sb ion implanted area 12. Oxide layer 14 is preferably removed by an ox-remove process or a BOE ox-remove process and is more preferably removed by a BOE ox-remove process.

Surface 19 of Sb ion implanted area 12 is not pitted due to the process of the instant invention.

Growth of Epitaxial Silicon Layer 18

Figure 7:
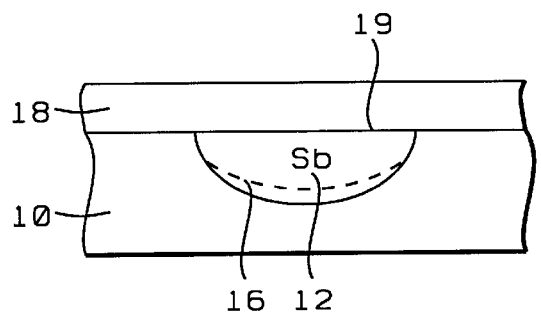

As shown in FIG. 7, epitaxial silicon layer 18 is grown over wafer 10 and Sb ion implanted area 12. Epi film 18 may be either a P-type epi (boron dopant) or an N-type epi (phosphorous or arsenic dopant). Dislocation loops and stacking faults are substantially decreased within and upon epitaxial silicon layer 18 due to the substantially smooth surface 19 of buried Sb ion implanted area/layer 12. This reduces the risk of current leakages and yield losses.

Buried driven-in Sb ion implanted area 12 layer may then be used to form bi-polar devices.

ADVANTAGES OF THE PRESENT INVENTION

The advantages of the present invention include:
1. the surface of buried antimony ion implanted area layer 12 is substantially pit-free;
2. a lower step height 32 will reduce the possibility of a water mark; and
3. the pit-free surface of buried antimony ion implanted area layer 12 can avoid current leakage of device and yield loss.

While particular embodiments of the present invention have been illustrated and described, it is not intended to limit the invention, except as defined by the following claims.

We claim:

1. A method of driving-in antimony into a wafer, including the steps of:
    A. loading a wafer into an annealing furnace/tool; the wafer having an area of implanted antimony ions;
    B. annealing the wafer a first time at a first temperature in the presence of only a first nitrogen gas flow rate;
    C. ramping-down the wafer from the first temperature to a second temperature in the presence of only an oxygen gas flow rate;
    D. maintaining the wafer in the presence of the oxygen gas flow rate in the absence of hydrogen at the second temperature;
    E. ramping-up the wafer from the second temperature to a third temperature in the presence of only the oxygen gas flow rate; and
    F. annealing the wafer a second time at the third temperature in the presence of only a second nitrogen gas flow rate to drive-in the antimony ions within the area of implanted antimony.

2. The method of claim 1, wherein the area of implanted antimony ions have an antimony ion concentration of from about 1 E 15 to 5 E 15 ions/cm$^3$.

3. The method of claim 1, wherein the first temperature is from about 985 to 1015° C.; the second temperature is from about 885 to 915° C.; and the third temperature is from about 1185 to 1215° C.

4. The method of claim 1, wherein the first temperature is about 1000° C.; the second temperature is about 900° C.; and the third temperature is about 1200° C.

5. The method of claim 1, wherein the oxygen gas flow rate is from about 9 to 11 SLM.

6. The method of claim 1, wherein the oxygen gas flow rate is about 10 SLM.

7. The method of claim 1, wherein during at least a portion of the maintenance of the wafer, a source of chlorine is introduced.

8. The method of claim 1, wherein during at least a portion of the maintenance of the wafer, TLC is introduced at a flow rate of from about 0.27 to 0.33 SLM for from about 32 to 38 minutes.

9. The method of claim 1, wherein during at least a portion of the maintenance of the wafer, TLC is introduced at a flow rate of about 0.3 SLM for about 35 minutes.

10. The method of claim 1, wherein the nitrogen gas flow rate during the first anneal is from about 12.6 to 15.4 SLM.

11. The method of claim 1, wherein the nitrogen gas flow rate during the first anneal is about 14 SLM.

12. The method of claim 1, wherein an oxide layer is grown over the wafer during steps C through E.

13. The method of claim 1, wherein an oxide layer is grown over the wafer during steps C through E; and including the following steps:
    removing the oxide layer after the second annealing step; and
    growing an epitaxial layer over the wafer.

14. The method of claim 1, wherein an oxide layer is grown over the wafer during steps C through E; and including the following steps:

removing the oxide layer after the second annealing step;

growing an epitaxial layer over the wafer; and fabricating bipolar devices within the structure.

15. A method of driving-in antimony into a wafer, including the steps of:

loading a wafer into an annealing furnace/tool; the wafer having an area of implanted antimony ions;

annealing the wafer a first time at a first temperature in the presence of only a first nitrogen gas flow rate;

growing an oxide layer over the wafer during:

ramping-down of the wafer from the first temperature to a second temperature in the presence of only an oxygen gas flow rate;

maintenance of the wafer in the presence of the oxygen gas flow rate at the second temperature; and ramping-up of the wafer from the second temperature to a third temperature in the presence of only the oxygen gas flow rate;

annealing the wafer a second time at the third temperature in the presence of only a second nitrogen gas flow rate to drive-in the antimony ions within the area of implanted antimony.

16. The method of claim 15, wherein the area of implanted antimony ions have an antimony ion concentration of from about 1 E 15 to 5 E 15 ions/cm$^3$.

17. The method of claim 15, wherein the first temperature is from about 985 to 1015° C.; the second temperature is from about 885 to 915° C.; and the third temperature is from about 1185 to 1215° C.

18. The method of claim 15, wherein the first temperature is about 1000° C.; the second temperature is about 900° C.; and the third temperature is about 1200° C.

19. The method of claim 15, wherein the oxygen gas flow rate is from about 9 to 11 SLM.

20. The method of claim 15, wherein the oxygen gas flow rate is about 10 SLM.

21. The method of claim 15, wherein during at least a portion of the maintenance of the wafer, TLC is introduced.

22. The method of claim 15, wherein during at least a portion of the maintenance of the wafer 10, TLC is introduced at a flow rate of from about 0.27 to 0.33 SLM for from about 33 to 37 minutes.

23. The method of claim 15, wherein during at least a portion of the maintenance of the wafer, a source of chlorine is introduced at a flow rate of about 0.3 SLM for about 35 minutes.

24. The method of claim 15, wherein the nitrogen gas flow rate during the first anneal is from about 12.6 to 15.4 SLM.

25. The method of claim 15, wherein the nitrogen gas flow rate during the first anneal is about 14 SLM.

26. The method of claim 15, including the steps of:

removing the oxide layer after the second annealing step; and growing an epitaxial layer over the wafer.

27. The method of claim 15, including the steps of:

removing the oxide layer after the second annealing step;

growing an epitaxial layer over the wafer; and fabricating bipolar devices within the structure.

28. A method of driving-in antimony into a wafer, including the steps of:

A. loading a wafer into an annealing furnace/tool; the wafer having an area of implanted antimony ions; the area of implanted antimony ions having an antimony ion concentration of from about 1 E 15 to 5 E 15 ions/cm$^3$;

B. annealing the wafer a first time at a first temperature in the presence of only a first nitrogen gas flow rate; the first temperature being from about 985 to 1015° C.;

C. ramping-down the wafer from the first temperature to a second temperature in the presence of only an oxygen gas flow rate; the second temperature being from about 885 to 915° C.;

D. maintaining the wafer in the presence of the oxygen gas flow rate in the absence of hydrogen at the second temperature;

E. ramping-up the wafer from the second temperature to a third temperature in the presence of only the oxygen gas flow rate; the third temperature is from about 1185 to 1215° C.; and F. annealing the wafer a second time at the third temperature in the presence of only a second nitrogen gas flow rate to drive-in the antimony ions within the area of implanted antimony.

29. The method of claim 28, wherein the first temperature is about 1000° C.; the second temperature is about 900° C.; and the third temperature is about 1200° C.

30. The method of claim 28, wherein the oxygen gas flow rate is from about 9 to 11 SLM.

31. The method of claim 28, wherein the oxygen gas flow rate is about 10 SLM.

32. The method of claim 28, wherein during at least a portion of the maintenance of the wafer, a source of chlorine is introduced.

33. The method of claim 28, wherein during at least a portion of the maintenance of the wafer, TLC is introduced at a flow rate of from about 0.27 to 0.33 SLM for from about 32 to 38 minutes.

34. The method of claim 28, wherein during at least a portion of the maintenance of the wafer, TLC is introduced at a flow rate of about 0.3 SLM for about 35 minutes.

35. The method of claim 28, wherein the nitrogen gas flow rate during the first anneal is from about 12.6 to 15.4 SLM.

36. The method of claim 28, wherein the nitrogen gas flow rate during the first anneal is about 14 SLM.

37. The method of claim 28, wherein an oxide layer is grown over the wafer during steps C through E.

38. The method of claim 28, wherein an oxide layer is grown over the wafer during steps C through E; and including the following steps:

removing the oxide layer after the second annealing step; and growing an epitaxial layer over the wafer.

39. The method of claim 28, wherein an oxide layer is grown over the wafer during steps C through E; and including the following steps:

removing the oxide layer after the second annealing step;

growing an epitaxial layer over the wafer; and fabricating bipolar devices within the structure.

40. A method of driving-in antimony into a wafer, including the steps of:

A. loading a wafer into an annealing furnace/tool; the wafer having an area of implanted antimony ions;

B. annealing the wafer a first time at a first temperature in the presence of only a first nitrogen gas flow rate;

C. forming an oxide layer over the implanted antimony ion area using dry oxidation processes at a second and third temperatures; and D. annealing the wafer at the third temperature in the presence of only a second nitrogen gas flow rate to drive-in the antimony ions within the area of implanted antimony.

41. The method of claim 40, wherein the oxide layer formation is conducted during the sub-steps comprising:
1) ramping-down the wafer from the first temperature to a second temperature in the presence of only an oxygen gas flow rate;
2) maintaining the wafer in the presence of the oxygen gas flow rate in the absence of hydrogen at the second temperature; and
3) ramping-up the wafer from the second temperature to a third temperature in the presence of only the oxygen gas flow rate.

42. The method of claim 40, wherein the area of implanted antimony ions have an antimony ion concentration of from about 1 E 15 to 5 E 15 ions/cm$^3$.

43. The method of claim 40, including the steps of:
removing the oxide layer after the annealing step; and
growing an epitaxial layer over the wafer.

44. The method of claim 40, including the steps of:
removing the oxide layer after the annealing step;
growing an epitaxial layer over the wafer; and
fabricating bipolar devices within the structure.

* * * * *